Jan. 24, 1967 N. A. CALANDRELLO ET AL 3,300,340

BONDED CONTACTS FOR GOLD-IMPREGNATED SEMICONDUCTOR DEVICES

Filed Feb. 6, 1963 2 Sheets-Sheet 1

INVENTORS.
NICOLA A. CALANDRELLO
JOHN HILL
JOHN ROYAN
BY Thomas J. Kilganon, Jr.
AGENT

BONDED CONTACTS FOR GOLD-IMPREGNATED SEMICONDUCTOR DEVICES

Filed Feb. 6, 1963 2 Sheets-Sheet 2

INVENTOR.
NICOLA A. CALANDRELLO
JOHN HILL
JOHN ROYAN

United States Patent Office 3,300,340

Patented Jan. 24, 1967

3,300,340

BONDED CONTACTS FOR GOLD-IMPREGNATED SEMICONDUCTOR DEVICES

Nicola A. Calandrello, Andover, and John Hill and John Royan, Wakefield, Mass., assignors to International Telephone and Telegraph Corporation, Nutley, N.J., a corporation of Maryland Filed Feb. 6, 1963, Ser. No. 256,631
5 Claims. (Cl. 117—217)

This invention relates to a method and means for forming contacts for electrical devices and more particularly to a method and means for forming ohmic contacts for semi-conductor devices.

The technique of manufacturing semi-conductor devices, such as diodes and transistors, has progressed greatly since the fundamental developments were propounded nearly two decades ago. The demands for new solid state devices and rigid space-age specifications have, however, outstripped the manufacturing and fabricating capabilities of even the most advanced laboratories to such an extent that reproducibility, reliability and cost are still major areas of concern. Questions of reproducibility, reliability, and cost do not appear to be of major concern in the production of the "exotic" portions of semi-conductor devices, that is, in the production of junctions, crystal growth and in the definition of semi-conductor parameters such a capacitance, resistivity and minority carrier lifetimes. Strangely enough, the major problem in the semi-conductor art arises in the fabricating of suitable contact arrangements, which are capable of withstanding large amounts of shock, vibration and other stresses. More often than not, a perfectly good diode or transistor must be thrown away because the contacts of the device have failed under test. The major causes of failure result from a compromise between a basically unstable mechanical design and the desire to utilize relatively well-proven manufacturing techniques and materials. Under such conditions, the yield of good devices is low and the reject rate high. The low yield drives up the unit cost of the semi-conductor devices, but since practically all manufacturers utilized the same techniques in forming contacts, competitive advantages were sought for and obtained in other areas. Because reliability and low cost have become the watch-words in this competitive field, more so now than ever before, and because few other areas for reducing cost and increasing reliability exist, attention was focused on the formation of contacts for semi-conductor devices in an attempt to increase both yield and profit margins. While many recommendations and advances have been made, little real change has been made in contact structures in the past few years. A need, therefore, exists for a contact for semi-conductor devices, which, because of its reliability increases the yield of such devices resulting in low-cost, mass produced components.

It is, therefore, an object of this invention to provide a method of manufacturing a novel contact structure which is substantially more reliable, more reproducible, and less costly than prior art contact arrangements.

A further object of this invention is the provision of a contact manufacturing method, which is particularly amenable to mass-production techniques.

Another object of this invention is to provide a contact structure for semi-conductor devices which is capable of withstanding extreme values of shock and vibration without failure during test.

A still further object of this invention is to provide a semi-conductor device in which all the elements of the device are molecularly bonded or alloyed.

Another object of this invention is to provide planar semi-conductive devices, such as diodes and transistors which incorporate the contact structure of this invention.

Yet, another object of this invention is to provide a method of forming contacts which is particularly adapted to the mass production of planar semi-conductive devices.

Other objects and features of this invention and the means of attaining them will become apparent from the following figures and description thereof, wherein.

Figure 1:
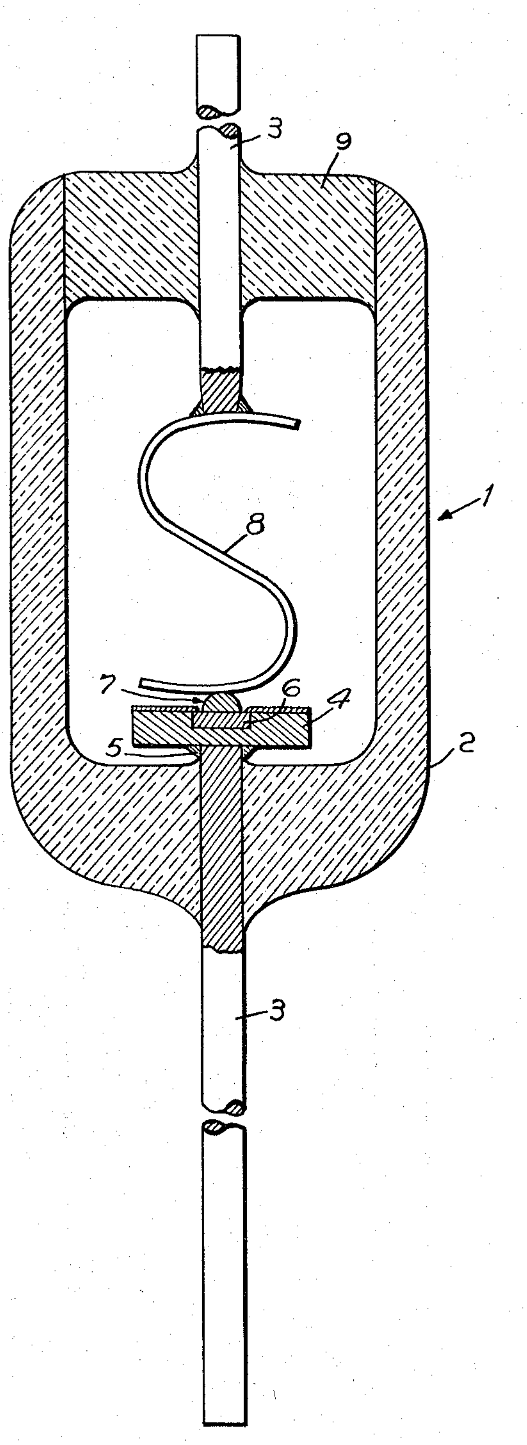
Fig. 1 (PRIOR ART)
FIGURE 1 is a greatly enlarged cross-sectional view of an encapsulated semi-conductor diode constructed in accordance with prior art methods.

Referring now to FIGURE 1, there is shown a planar diode encapsulated in a glass envelope 2 and having conductive leads 3 extending from the extremities of the glass envelope 2. The lower terminal 3 is attached to a wafer 4 of semi-conductive material by means of solder portion 5. Semi-conductive wafer 4 has a doped region 6 located at the geometrical center of the wafer. In accordance with techniques well known to those skilled in the art, P or N-type dopants are diffused into the semi-conductor wafer depending on the conductivity type of the wafer 5. Wafer 5, for instance, may be N-type silicon and the doped region 7 may be a P-type material, such as boron. A contact 7, usually of gold is formed before assembly from a gold pellet by pressing the pellet onto the surface of region 6 while the wafer 4 is heated on a hot surface. Finally, S-lead 8, which has been preassembled with upper terminal 3 and glass closure member 9, is placed in contact with contact 7, and upon application of heat to seal envelope 2, S-lead 8 becomes mechanically bonded to contact 7. In such structures, failures most often occur under shock and vibration stresses where the contact 7 is attached to doped region 6 and where S-lead 8 is attached to the surface of contact 7. The failures result because of the relative weakness of the mechanical bond between S-lead 8 and contact 7 and because of the difficulty in obtaining consistently reliable and reproducible bonds between contact 7 and diffused portion 6. The latter defect arises because the assembly technique is subject to operator error, and because it is practically impossible to attain the desired temperature and pressure necessary to make a reliable bond. This can readily be appreciated when it is realized that each of these prior art devices is individually assembled by hand. From the foregoing, it can easily be seen that such devices have a high rate of failure and that yields, as is well known, are usually no better than 50 percent. It is also obvious that such prior art devices are not subject to mass-production techniques.

Figure 2:
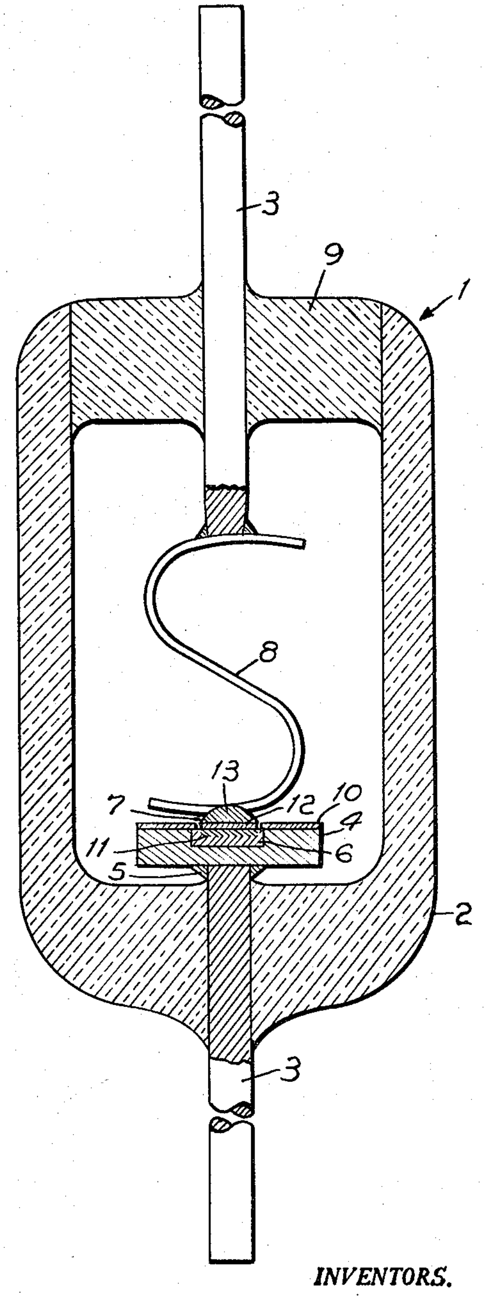
FIGURE 2 is a greatly enlarged cross-sectional view of an encapsulated semi-conductor diode constructed in accordance with the preferred process of this invention.

Referring now to FIGURE 2, there is shown a planar semi-conductor diode which has been greatly enlarged for purposes of explanation. The same reference numerals have been utilized in FIGURE 2 where they refer to same elements as shown in FIGURE 1. A semi-conductor wafer 4 of silicon or some other suitable material is shown disposed internally of capsule 2 and mounted on lower conductive lead 3 by means of a soldered connection 5. Wafer 4 contains a diffused region 6 such as boron where the conductivity type of silicon utilized is N-type. It is, of course, to be understood that the conductivity type of the wafer 4 and diffused region 6 may be interchanged without affecting the utility of this invention. A layer 10, of insulating material such as silicon dioxide is shown covering the upper surface of wafer 4 with the exception of a region at the geometrical center of the wafer in which the novel contact of this invention is formed. A "window" is thus present in the insulating layer 10 exposing at least a portion of the boron-doped silicon surface of wafer 4. The insulating layer 10 masks the surface of wafer 4 during forming of contact 7 and may be removed before assembly. Layer 10, however, may be included in the assembled diode because it provides a measure of protection in radiation containing environments. While only a single planar diode is shown in FIGURE 2 in its finally assembled form, it should be appreciated that the contact to be described hereinafter is simultaneously formed with hundreds of other contacts. This will become apparent when the process for forming such contacts is described.

Returning to FIGURE 2, the contact 7 of this invention consists of a region 11 of noble metal, preferably gold or palladium, a layer 12 of conductive metal, preferably nickel and a built-up layer of solder 13. The solder utilized may be any standard solder such as lead-tin alloys but where additional protection against radiation is required layer 13 is preferably composed of pure lead. From the foregoing, it can be seen that in addition to the advantage resulting from the process to be described hereinafter, the presence of the solder layer 13 permits the formation of an extremely rigid and reliable bond with the material of S-lead 8 when upper lead 3 and glass closure member 9 are heat-sealed to envelope 2. S-lead 8, usually made of platinum or palladium is pressed against contact 7 prior to heat-sealing. Upon application of heat to seal envelope 2, heat is radiated to solder layer 13 and conducted through S-lead 8 such that the solder in layer 13 melts and bonds with the material of S-lead 8. In this manner, an extremely rigid contact arrangement is obtained which is capable of withstanding *"g"* forces in excess of 50,000.

Figure 3:
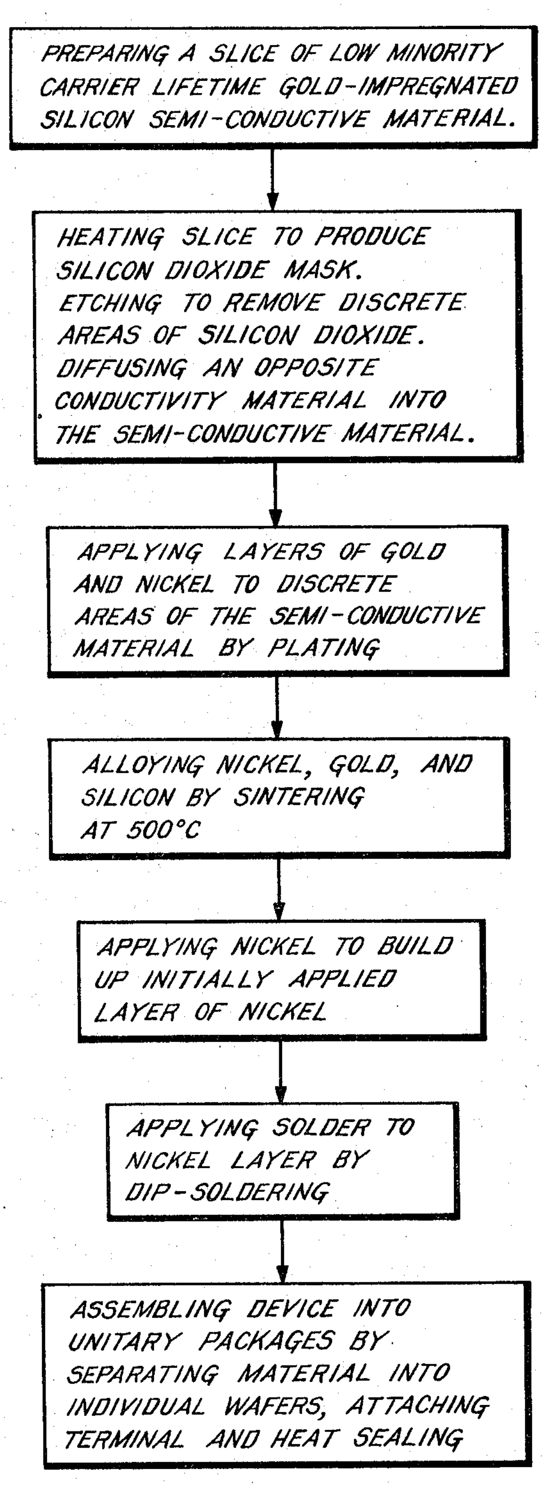
FIGURE 3 is a flow chart of the steps followed in manufacturing a preferred embodiment of this invention.

Referring now to FIGURE 3, the elaboration of the steps outlined in the flow chart will clearly show how the ultra-reliable, highly reproducible, low cost semi-conductor devices of this invention are attained.

Slices of semi-conductive material such as silicon, germanium, gallium arsenide, and others are prepared for this process by sawing the slices from a single crystal bar of the material. The material may be P or N-type. After suitably polishing a slice of silicon, for instance, a layer of silicon dioxide is formed on the surface of the material by heating the slice in an oxidizing atmosphere preferably, in pure oxygen or air. "Windows" or discrete areas of silicon dioxide are removed using an etching-photo-resist technique well known to those skilled in the art. Approximately four hundred of these areas have been removed from a single slice of silicon but the number of areas is limited only by the size of the slice obtainable or by the close proximity of the junctions to each other. As an alternative to oxidizing the silicon slice and etching, a mechanical mask may be utilized which has a like number of "windows" disposed therein. The purpose of the "windows" is to permit the diffusion of a dopant, of either N or P-type conductivity depending on the conductivity of the silicon only on those portions of the silicon surface which are exposed through the "windows" and to protect the silicon surface during other steps in the process. When diffusion is completed, a thin layer of noble metal, preferably gold or palladium is applied through the windows only onto the doped silicon by plating. An electroless plating technique may be utilized. Alternatively, a layer of noble metal may be vaporized onto the doped silicon surface, but plating is preferred because of the ease in controlling the thickness of the plated layer. A layer of conductive metal, preferably nickel is then applied in overlying relationship to the noble metal layer by plating. An electroless nickel plating technique may be utilized or alternatively, nickel may be vaporized onto the gold. An electrolytic plating technique may also be utilized with good effect.

At this point in the process, the silicon slice having the layers of gold and nickel plated in the several hundred "windows" etched therein, is subjected to an alloying step at a temperature sufficient to cause alloying of the gold, nickel and silicon. To accomplish proper alloying, the silicon slice is sintered in a temperature range of 375 to 900° C. for five minutes. It has been found that a consistently high quality diode, both mechanically and electrically, has been produced when the sintering is done at a temperature of 500° C. for five minutes. This relatively low temperature is preferred for a number of reasons. Phosphorus, which is present to some degree, in all nickel has a low diffusion rate at this temperature. "Gettering" of gold by the metal is substantially eliminated by sintering at this relatively low temperature thereby maintaining the low minority carrier lifetime which was present prior to sintering. Also, sintering at 500° C. reduces thermal stresses usually encountered in manufacturing and good uniformity of alloying is obtained.

After alloying, another nickel plating step is carried out to build up the thickness of the nickel surface. This is done preparatory to the next step, that of dip soldering, to cause the contact to protrude slightly above the silicon dioxide layer to facilitate adherence of solder to the contact.

Prior to dip soldering, the slice is immersed in a flux to facilitate adherence of solder to the nickel and to prevent oxidation of the solder. Oxidation of the solder will provide a poor ohmic contact. The use of solder at the anode and cathode of a diode is considered to be unique. The use of the nickel plated layer permits the use of solder. Ordinarily, solder will not adhere well to very thin layers of gold. While the use of solder is an important step in producing semi-conductor devices which are highly resistant to shock and vibration, if it is desired to product lower cost diodes, the use of solder may be dispensed with and a pressure contact with an S-lead made.

The solder dipping step is controllable and depending upon the type of solder and the length of time of immersing, the build-up of the solder on the nickel can be varied such that values of case capacitance are controllable. At this point, it should be recalled that the layer of silicon dioxide initially placed on the surface of the semi-conductor slice is present and prevents the adherence of both the plated metals and the solder on areas other than the etched-out "window" areas.

Finally, the step of assembling semi-conductor devices is undertaken and this step includes the step of scribing the semi-conductive slice into wafers having the contact of this invention at their geometrical centers. The discrete wafers are then soldered to a cathode terminal within a glass capsule. An anode contact including an S-lead and capsule closure member is then positioned within the glass capsule. One end of the S-lead is welded to a terminal which passes through a glass capsule closure member, and the other end of the S-lead is placed in pressure contact with the solder layer of the contact. During the heat sealing operation of the capsule, the solder is melted and the S-lead, upon cooling of the diode, becomes strongly bonded to the solder forming a rigid contact structure which is not subject to failure under high shock and vibration testing. It should be remembered that in prior art diodes that the S-lead contact with the gold pellet is basically a pressure contact because the temperature generated during sealing is not sufficiently high to melt the gold.

From the foregoing, it may be seen that semi-conductor devices can be manufactured on a mass-production basis, which are not subject to human error during assembly. Further, a highly rigid contact arrangement is obtained which is substantially better than prior art devices and which is considerably less expensive than prior art devices. This becomes apparent when it is recognized that utilizing the prior art thermo-compression bonding technique, a single operator can produce only a few hundred finally assembled devices per hour. The process of the present invention permits a single operator to produce in excess of one hundred thousand (100,000) finally assembled devices per hour.

Figure 4:
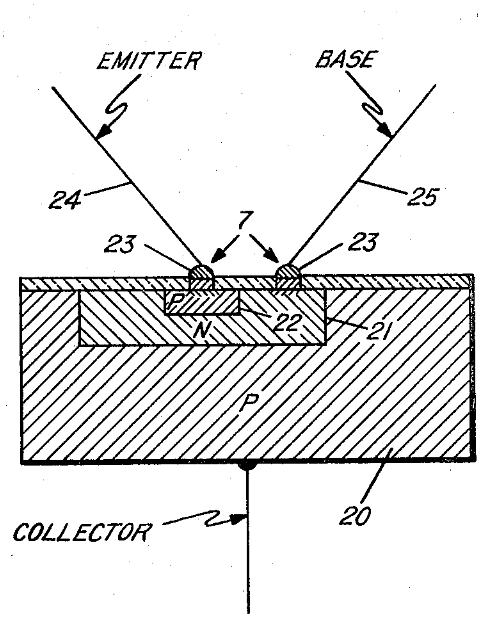
FIGURE 4 is a greatly enlarged cross-sectional view of a planar transistor constructed in accordance with the process of this invention.

While this process has been described in connection with the manufacture of planar diodes, it should be recognized that the contact structure and manufacturing process are applicable in the manufacture of other semiconductor devices such as planar transistors. FIGURE 4 shows a three terminal planar transistor which utilizes the contacts of this invention. A semi-conductor material 20 such as P-type silicon is shown having diffused regions 21, 22 of predominantly N and P-type conductivity respectively. A layer of silicon dioxide 23, having "windows" 24 etched therein is disposed on the surface of semi-conductor 20. Contacts 7 are shown disposed on the surface of semi-conductor 20 which is exposed through "windows" 24. The contact structure is exactly as shown in FIGURE 2 and the steps in the process are exactly the same as described hereinabove. The only variation from the process described is that two "windows" are required and the etching photo-resist step is slightly varied to properly position the windows. Emitter and base leads 25, 26 are attached to the solder and rigidly held after heating and cooling to provide a transistor device which has all the attributes and advantages such as described in connection with the device of FIGURE 2.

Material 20 and diffused regions 21, 22 may, of course, have an N-P-N configuration without departing from the spirit of this invention.

While we have described the principles of our invention in connection with specific structure and method steps, it is to be clearly understood that this description is made only by way of example and not as a limitation to the scope of our invention as set forth in the objects thereof and in the accompanying claims.

We claim:

1. A method for forming a contact to a silicon semiconductor wafer whose minority carrier lifetime has been reduced by impregnation with gold, comprising the steps of:

applying a coating of gold to a surface of said wafer;

applying a coating of a conductive metal atop said gold coating, said metal being capable of alloying with gold at temperatures within a predetermined range, said metal exhibiting substantial gettering of gold in silicon at temperatures in excess of a particular threshold value; and sintering said coatings together at a temperature within said predetermined range and not exceeding said threshold value thereby to preclude gettering of gold by said metal from said impregnated wafer, thus preserving the reduced minority carrier lifetime of said wafer.

2. A method according to claim 1, wherein said sintering temperature is in the range of 375 to 900° C.

3. A method according to claim 2, wherein said sintering temperature is approximately 500° C.

4. A method according to claim 1, wherein said conductive metal is nickel.

5. A method according to claim 4, wherein said given time is approximately 5 minutes.

References Cited by the Examiner

UNITED STATES PATENTS

| | | | |
|---|---|---|---|
| 2,736,847 | 2/1956 | Barnes | 317—234 |
| 2,793,420 | 5/1957 | Johnston et al. | 317—240 |
| 2,957,112 | 10/1960 | Sils | 317—234 |
| 2,964,689 | 12/1960 | Buschert et al. | 148—33.5 |
| 2,989,578 | 6/1961 | Wagner et al. | 317—234 X |
| 2,989,650 | 6/1961 | Doucette et al. | 317—234 |
| 3,028,663 | 4/1962 | Iwersen et al. | 317—234 X |
| 3,064,167 | 11/1962 | Hoerni | 317—234 |
| 3,067,485 | 12/1962 | Ciccolella et al. | 317—235 X |
| 3,132,408 | 6/1964 | Pell | 148—1.5 |
| 3,169,304 | 2/1965 | Gould. | |
| 3,171,067 | 2/1965 | Trent | 317—234 |
| 3,196,325 | 7/1965 | Swartz | 317—234 |
| 3,214,654 | 10/1965 | Armstrong et al. | 317—237 |

JOHN W. HUCKERT, *Primary Examiner.*

A. M. LESNIAK, *Assistant Examiner.*